United States Patent
Todt

(10) Patent No.: US 8,643,943 B2
(45) Date of Patent: Feb. 4, 2014

(54) TUNABLE LASER SOURCE USING INTRACAVITY LASER LIGHT OUTCOUPLING AND MODULE CONTAINING THE SAME

(75) Inventor: Rene Todt, Tokyo (JP)

(73) Assignee: NEC Corporation, Tokyo (JP)

( * ) Notice: Subject to any disclaimer, the term of this patent is extended or adjusted under 35 U.S.C. 154(b) by 640 days.

(21) Appl. No.: 12/922,790

(22) PCT Filed: Apr. 30, 2008

(86) PCT No.: PCT/JP2008/058588
§ 371 (c)(1),
(2), (4) Date: Sep. 15, 2010

(87) PCT Pub. No.: WO2009/133631
PCT Pub. Date: Nov. 5, 2009

(65) Prior Publication Data
US 2011/0038036 A1    Feb. 17, 2011

(51) Int. Cl.
*H01S 5/022* (2006.01)
*H01S 5/026* (2006.01)

(52) U.S. Cl.
USPC .......................................... 359/346; 359/333

(58) Field of Classification Search
USPC .................................. 359/346, 333
See application file for complete search history.

(56) References Cited

U.S. PATENT DOCUMENTS

| | | | |
|---|---|---|---|
| 5,793,521 A * | 8/1998 | O'Brien et al. ............... | 359/344 |
| 6,822,980 B2 | 11/2004 | Lundqvist | |
| 2002/0136259 A1 | 9/2002 | Evans | |
| 2003/0035449 A1 * | 2/2003 | Tomlinson et al. ......... | 372/29.02 |
| 2004/0062483 A1 | 4/2004 | Taghavi-Larigani et al. | |
| 2006/0153267 A1 | 7/2006 | Suzuki et al. | |
| 2006/0198401 A1 | 9/2006 | Suzuki et al. | |
| 2006/0198415 A1 | 9/2006 | Yamazaki | |
| 2006/0198416 A1 | 9/2006 | Yamazaki | |
| 2006/0222038 A1 | 10/2006 | Yamazaki | |
| 2006/0222039 A1 | 10/2006 | Yamazaki | |
| 2007/0172186 A1 | 7/2007 | Tsunoda | |
| 2011/0002355 A1 * | 1/2011 | Jansen ....................... | 372/50.11 |

FOREIGN PATENT DOCUMENTS

| | | |
|---|---|---|
| DE | 3529321 A | 2/1987 |
| EP | 0141420 A | 5/1985 |
| EP | 0282237 A | 9/1988 |
| EP | 0688069 A | 12/1995 |
| WO | 2006104441 A | 10/2006 |

OTHER PUBLICATIONS

International Search Report for PCT/JP2008/058586 mailed Jan. 14, 2009.

M. L. Nielsen et al., "Integration of Functional SOA on the Gain Chip of an External Cavity Wavelength Tunable Laser Using Etched Mirror Technology", IEEE J. Select. Topics Quantum Electron., vol. 13, No. 5, Sep./Oct. 2007, pp. 1104-1111.

(Continued)

*Primary Examiner* — Mark Hellner

(74) *Attorney, Agent, or Firm* — Sughrue Mion, PLLC

(57) ABSTRACT

A laser source includes a laser beam generating section for generating a laser beam in a cavity between first reflector and a second reflector; and a tap section provided in the cavity to take out a part of the laser beam. The laser source is a waveguide-based laser source.

19 Claims, 8 Drawing Sheets

(56) References Cited

OTHER PUBLICATIONS

U. Koren et al.. "A 1.3-μm Wavelength Laser with an Integrated Output Power Monitor Using a Directional Coupler Optical Power Tap", IEEE Photon. Technol. Lett., vol. 8, No. 3, Mar. 1996, pp. 364-366.

T. F. Krauss et al., "Impact of Output Coupler Configuration on Operating Characteristics of Semiconductor Ring Lasers", J. Lightwave Technol., vol. 13, No. 7, Jul. 1995, pp. 1500-1507.

S. Matsuo et al., "Stable and Fast Wavelength Switching in Digitally Tunable Laser Using Chirped Ladder Filter", IEEE J. Select. Topics Quantum Electron., vol. 13, No. 5, Sep./Oct. 2007, pp. 1122-1128.

* cited by examiner

Fig. 1  -- PRIOR ART --

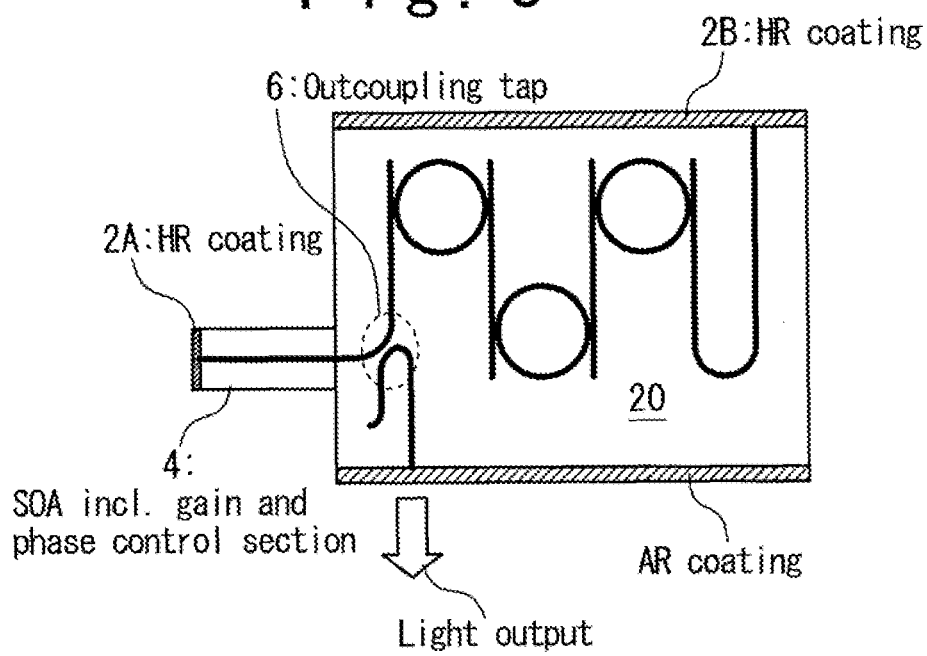
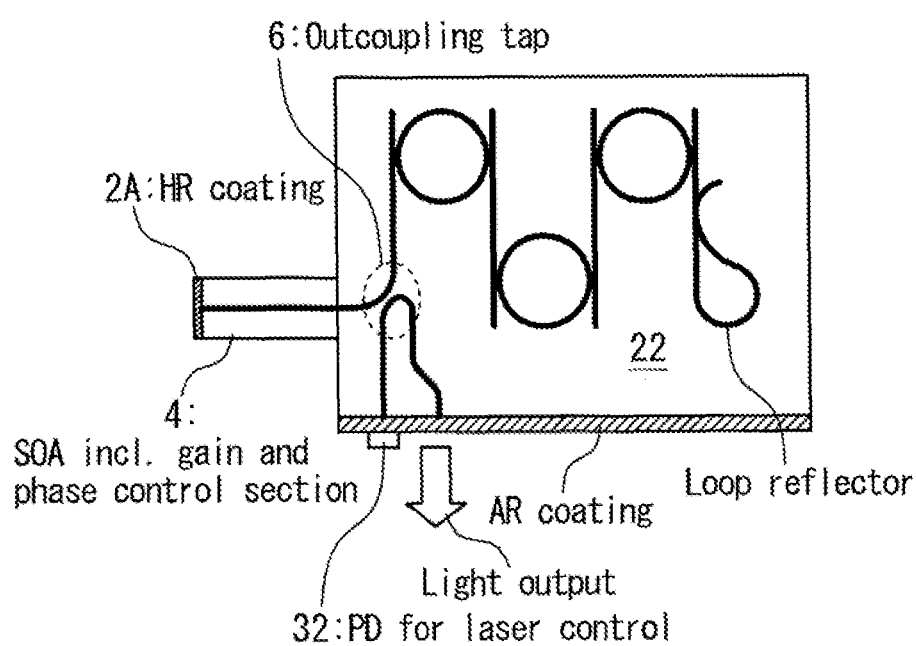

TUNABLE LASER SOURCE USING INTRACAVITY LASER LIGHT OUTCOUPLING AND MODULE CONTAINING THE SAME

The present application is the National Phase of PCT/JP2008/058588, filed Apr. 30, 2008.

TECHNICAL FIELD

The present invention relates to Fabry-Pérot (FP) and distributed Bragg reflector (DBR) type lasers, as well as to wavelength tunable lasers.

BACKGROUND ART

Lasers are used as light sources in numerous applications. Among the most commonly employed laser sources are Fabry-Pérot (FP), distributed Bragg reflector (DBR) and distributed feedback (DFB) laser diodes formed of compound semiconductors. Typically, the laser light is emitted from a partially transparent reflector that establishes an optical resonator or cavity required for the laser operation. The partially transparent reflector is commonly formed by a cleaved facet, an etched facet, or a DBR mirror.

To put a laser into practical use, it needs to be combined with additional optical and/or optoelectronic components in an optical module. Among these components are, for example, beam-splitters required to realize output power monitors, etalons to realize wavelength lockers, or variable optical attenuators (VOAs) required for shuttering or leveling of the output power.

These components and assembly processes related to them generate a considerable cost (typically more than 80% of a total production cost), and give rise to additional optical loss that reduces the output power of a laser module. Therefore, it is highly desirable to eliminate, such external components in order to reduce the production cost and to enhance the optical module performance.

Many of the above-mentioned functionalities provided by external bulk optical/optoelectronic components can be realized in various material systems as monolithic waveguide-based devices that can be produced on a chip-level scale and, thus, at reduced cost and in many cases enhanced performance. Examples for such monolithic waveguide-based devices are silicon- or silica-based planar lightwave circuits (PLCs) as well as the multitude of compound semiconductor-based optoelectronic devices.

The coupling of the laser output, which is usually emitted from the laser facet into a free space, into a second chip provides difficulty in practice due to an associated high loss.

Here, a brief overview of currently available outcoupling and integration schemes as well as related technologies will be given below.

At first, a Fabry-Pérot (FP) laser will be described. In case of a FP laser, a laser cavity is usually formed by cleaved facets (eventually having a low- or high-reflection (LR or HR) coating) that act as mirrors. To integrate such a device for example with power monitors, a wavelength locker, or a variable optical attenuator, either of a large number of external bulk optical/optoelectronic components would be employed as shown in FIG. 1) or a lens would have to be used to couple the light emitted from the laser facet to a second chip that provides a desired function (FIG. 2). While the former approach requires complex (i.e. high-precision) mounting techniques and expensive bulk components and additionally results in a large coupling loss, the latter approach avoids expensive bulk components but also suffers from a relatively large coupling loss and the need for high-precision mounting.

Next, a DBR laser will be described with reference to FIG. 3.

In the DBR laser, a mirror facet is not required since diffraction gratings incorporated in a laser diode provide reflection to form a laser cavity. Consequently, a laser light output in such devices can in principle be coupled directly to a wave guide in principle, and therefore, an additional optical function can be comparatively easily integrated. However, as the output light is emitted through a lossy diffraction grating, the DBR laser integration concept is impaired by a considerable output power penalty. Moreover, limitations arise from the fact that it is difficult, impractical, or impossible to realize certain reflection spectrum shapes, such as reflection spectrum that is substantially flat and has a certain uniform reflectivity over a wide wavelength range (for example, 100 nm or more, as required for some applications).

Also, integration using monolithically integrated wideband mirrors is known.

Other outcoupling schemes for the FP/DBR laser that strive to provide a possibility to integrate further functional units with the laser, are based on gap mirrors (FIG. 4) (a first related art), very high index contrast gratings (a second related art), and MMI-based mirrors (a third related art). The first related art is "Integration of Functional SOA on the Gain Chip of an External Cavity Wavelength Tunable Laser Using Etched Mirror Technology" (IEEE J. Select. Topics Quantum Electron., vol. 13, no. 5, pp. 1104-1111, 2007) by M. L. Nielsen et. al. Also, the second related art is U.S. Pat. No. 6,022,980 B2 titled "Tunable Semiconductor Laser with Integrated Wideband Grating", and granted to L. P. O. Lundqvist on 23 Nov. 2004. Also, the third related art is international. Publication (WO 2006/104441 A1) of an international patent application by P.-J. Rigole at al., titled "Integrated Photonic Circuit", and filed on 5 Oct. 2006.

The former two schemes are technologically demanding, and in particular, the gap mirror approach results in a very large coupling loss. The latter approach based on an MMI reflector is only suitable for a reflectivity of 50% and, thus, its applicability is very limited.

Also, the FP/DBR laser with an intracavity tap for power monitor is known. In a fourth related art ("A 1.3-µm Wavelength Laser with an Integrated Output Power Monitor Using a Directional Coupler Optical Power Tap", (IEEE Photon. Technol. Lett., vol. 8, no. 3, pp. 384-366, 1996) by U. Koren et al.), a FP laser diode, is presented that uses an intracavity tap to guide a small fraction of light to an integrated monitor photodiode, as shown in FIG. 5. This tap is, however, not used to outcouple the main light output from the laser (which is still emitted from the cleaved front facet of the laser chip) but only a small fraction of the total power that is needed for the power monitoring purpose. In the fourth related art, there is no comment on the feasibility to enhance the output power performance of certain FP/DBR laser diode configurations by outcoupling the in light output from the laser via an intracavity tap.

Also, a ring laser with intracavity outcoupling tap is known. In a ring laser, the light is traveling in a closed loop and, therefore, the only way to remove light from this closed loop is via an intracavity tap and is, hence, a very common outcoupling scheme in ring lasers, as disclosed in fifth and sixth related arts. The fifth related art is "Impact of Output Coupler Configuration on Operating Characteristics of Semiconductor Ring Lasers", (J. Lightwave Technol., vol. 13, no. 7, pp. 1500-1507, 1995) by T. F. Krauss et al. The sixth related art is "Stable and Fast Wavelength Switching in Digitally Tunable Laser Using Chirped Ladder Filter", (IEEE J. Select. Topics Quantum Electron., vol. 13, No. 5, pp. 1122-1128, 2007) by S. Matsuo at al.

DISCLOSURE OF INVENTION

Therefore, an object of the present invention is to provide a laser source in which a part of a laser light is taken out by using a tap.

Another object of the present invention is to provide a laser module using the above laser source, in which the number of optical components are reduced.

Still another object of the present invention is to provide a laser light outcoupling method.

In an exemplary aspect of the present invention, a laser source includes a laser beam generating section for generating a laser beam in a cavity between a first reflector and a second reflector; and a tap section provided in the cavity to take out a part of the laser beam.

In another exemplary aspect of the present invention, an optical module includes the above laser source; a first lens provided for the tap section; an optical isolator provided for the first lens; and a second lens provided for the optical isolator.

In still another exemplary aspect of the present invention, a laser beam outcoupling method includes; generating a laser beam in a cavity between a first reflector and a second reflector; and taking out a part of said laser beam from said cavity.

The present invention only concerns FP or DBR lasers and the like (more specifically waveguide-based lasers, whose optical cavity is formed by some sort of reflector or mirror) and aims at providing a path for the integration of additional functionalities with such devices as well as improving the performance of such lasers.

BRIEF DESCRIPTION OF DRAWINGS

The above and other objects, advantages and features of the present invention will be more apparent from the following description of certain exemplary embodiments taken in conjunction with the accompanying drawings, in which:

FIG. 8 is a diagram showing a 3-ring reflector tunable laser source based on a tap outcoupling scheme;

FIG. 9 is a diagram showing a 3-ring reflector tunable laser source in which a forward-oriented tap-port is utilized for outcoupling of an output light, while a backward-oriented tap-port is guided to a photodiode used to control the laser operation;

BEST MODE FOR CARRYING OUT THE INVENTION

Hereinafter, a laser with an intracavity outcoupling tap and a module incorporating the laser source will be described in detail with reference to the attached drawings.

Laser light outcoupling scheme of the present invention is based on an intracavity outcoupling tap. The taps can be realized in many different forms. As far as waveguide-based taps are concerned, common types are based on directional couplers (horizontally or vertically integrated), multi-mode interference (MMI) splitters, and Y-branch splitters.

Figure 6:
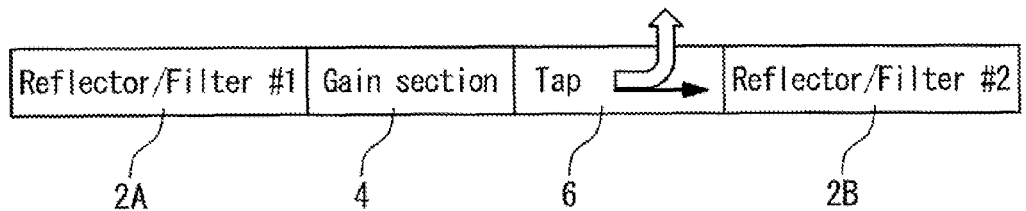
FIG. 6 is a diagram showing a typical structure of a laser according to a first exemplary embodiment of the present invention which utilizes an intracavity tap outcoupling scheme.

FIG. 6 is a diagram showing a general structure of a laser source utilizing an intracavity tap outcoupling scheme. Referring to FIG. 6, generally, the laser source can be considered as a concatenation of different sections. A Fabry-Pérot/distributed Bragg reflector (FR/DBR) laser or the like utilizing the intracavity tap outcoupling scheme includes a gain section 4, two reflector/filter sections (#1, #2) 2A and 2B on each side of the gain section 4, and a tap section 6 inserted between the gain section 4 and the reflector/filter section #2 2B. A laser light generating section is composed of the reflector/filter sections 2A and 2B, the gain section 4 and the tap section 6. In this example, the reflector/filter is provided to achieve an integrated function of a reflector function for reflecting a laser light and a filter function for adjusting the wavelength of the laser light, but a unit for realising the reflector function may be provided separately from a unit for realizing the filter function.

To achieve optimum output power performance, the intracavity tap should be placed on the side of the gain section 4 that faces the reflector/filter that has a higher optical loss (in the present example filter #2 2B). To achieve good output power performance, the tap would typically be desirably designed to outcouple a large fraction of incident light. More specifically, typically 50-90% of the incident light would be outcoupled. The large fraction of light coupled out by the tap has a significant difference from the intracavity tap power monitor described in the fourth related art, in which one strives to keep the tap-off fraction as small as possible, typically on the order of only a few percent and just large enough to sufficiently illuminate the detector photodiode. Obviously, the laser may include more than four sections.

Apart from the advantage, of providing its output light into a waveguide, it can be shown by simulations that the intracavity tap outcoupling scheme can provide superior output power performance than the related-art front facet outcoupling scheme at same threshold current) for certain laser configurations. Roughly speaking, this holds in particular if the reflector/filter #1 has a lower loss and the reflector/filter #2 has a higher loss. Owing to a large number of cavity layouts conceivable, however, it is very difficult to quantify in a general manner for which situations the front facet outcoupling scheme, or the intracavity tap outcoupling scheme provides superior output power performance.

Figure 7A:
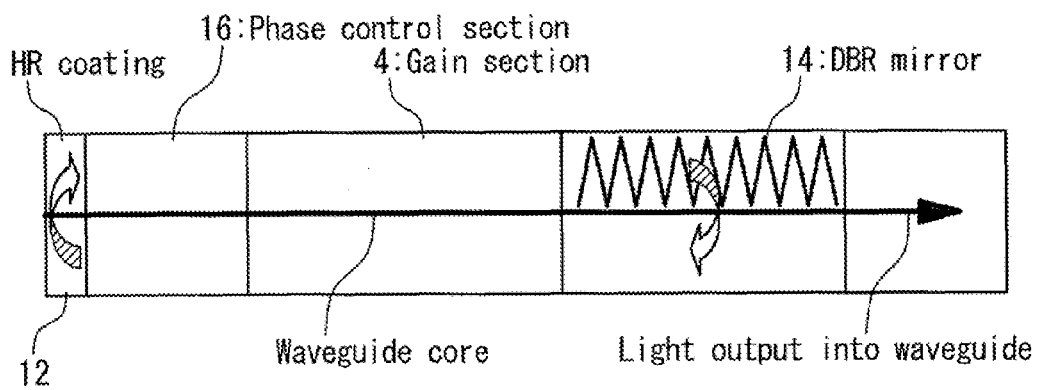
FIG. 7A is a diagram schematically showing a tunable 3-section DBR laser utilizing a conventional front facet outcoupling scheme.
Figure 7B:
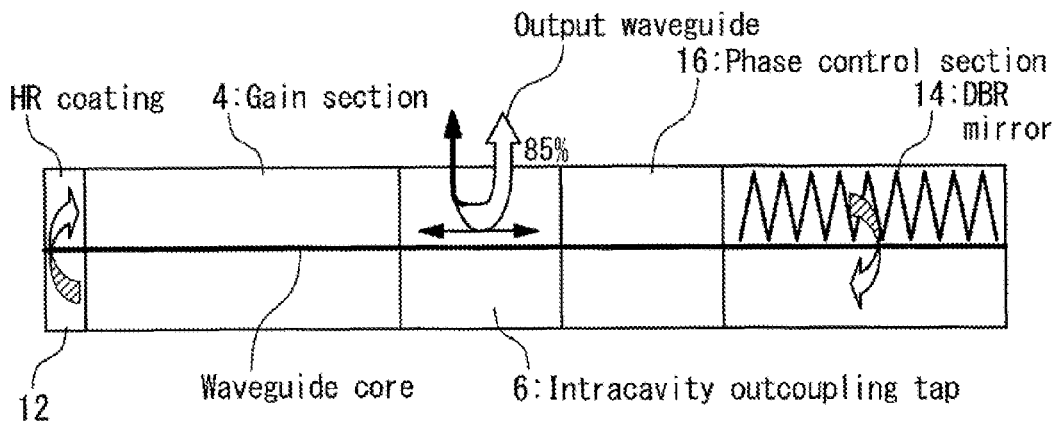
FIG. 7B is a diagram schematically showing a tunable 3-section DBR laser utilizing the intracavity tap outcoupling scheme according to an exemplary embodiment of the present invention.

Next, FIG. 7A is a diagram schematically showing a tunable 3-section DBR laser utilizing a front facet outcoupling scheme in a related art, and FIG. 7B is a diagram schematically showing a tunable 3-section DBR laser utilizing the intracavity tap outcoupling scheme according to another example of the present invention. The tunable 3-section DBR laser utilizing a front facet outcoupling scheme shown in FIG. 7A is composed of a reflector 12, a phase control section 16, a gain section 4, and a DBR mirror 14, and is connected to an output waveguide. On the other hand, the tunable 3-section DBR laser utilizing the intracavity tap outcoupling scheme in FIG. 7B is composed of a reflector 12, a phase control section 16, a (gain section 4, a tap section 6, and a DBR mirror 14, and the tap waveguide is connected to an output waveguide. The laser light, generating section is composed of the reflector 12, the phase control section 16, the gain section 4, the tap section 6, and the DBR mirror 14. Also, the phase control section 16 may be provided between the reflector 12 and the gain section 4 or between the gain section 4 and the tap section 6. The word "tunable" reflects in this context the fact that the emission wavelength of the laser can be changed by injecting current into the DBR mirror section 14 and into the phase control section 16. The DBR mirror section 14 achieves the reflector function and the filter function of coarsely adjusting the phase of the laser light simultaneously.

First of all, FIG. 7A shows the implementation in the related art, where the DBR mirror 14 that enables a single mode operation is used for coarse-tuning and is placed on the output side of the gain section 4. Light passing through this DBR mirror 14 is outputted into a waveguide, where it can be used for any desired further "processing". The opposite side of the gain section 4 is bound by the phase control section 16 and a high-reflection (HR) coating as the reflector 12. The HR coating achieves the reflector function, in FIGS. 7A and 7B. The phase control section 16 is used to fine-tune the emission wavelength of the laser. It should be noted that the DBR mirror 14 imposes a non-negligible loss that increases with the DBR mirror tuning and, hence, leads to a significant reduction in output power with increasing DBR mirror tuning.

On the other hand, utilising the tap outcoupling scheme in the tunable three-section DBR laser, the light is also outputted into a waveguide, but does not suffer the disadvantage of a strong decrease in output power with increasing DBR mirror tuning. This is due, to the location of the outcoupling tap section 6 directly next to the gain section 4, namely, between the gain section 4 and the lossy phase and DBR mirror sections 16 and 14. As a result of that location, a loss increase in the DAR mirror section 14 due to tuning results in a less severe decrease or even an increase in output power. Essentially, a loss increase in the DBR mirror section 14 results in an increase of the gain section amplification (caused by the well-known amplitude condition that needs to be fulfilled for lasing operation), which leads to an increased output power from the gain section 4 in order to compensate the increased optical loss. This is of course the same for the 3-section DBR laser based on the front facet outcoupling scheme in the related art. However, in that case, the increased gain section output is to a large extent simply absorbed in the DBR mirror section 14 and not emitted into the output waveguide. On the other hand, in the tap outcoupling scheme, the light emitted from the gain section 4 first needs to pass the outcoupling tap 6 before reaching the lossy phase control and DBR mirror sections 16 and 14. Consequently, the light output from the tap 6 will not decrease as much as in the outcoupling scheme in the related art or it may even increase slightly.

Moreover, depending on the details of the tap layout chosen, a certain amount of light reflected from the DBR mirror (in the following termed backward traveling light) 14 will be outcoupled into another waveguide. While this may represent an undesired loss mechanism, it offers also possibilities for monitoring and controlling the laser, as will be detailed later on.

Another example of the present invention is shown in FIG. 8. In this case, the tap outcoupling scheme is employed in a hybridely integrated tunable laser source (TLS), which includes a semiconductor optical amplifier (SOA) chip that is mounted and coupled to a PLC chip containing a multiple ring resonator filter. In this example, the HR coating as the reflectors 2A and 2B has the reflector function. The multiple ring resonator section has the filter function and a tap function. That is, the reflector function and the filter function are achieved separately. The cavity is formed between the reflectors 2A and 2B.

Details on this device can be found in seventh to twelfth related arts. The seventh related art is US Patent Application by Suzuki at al. (US 2006/0153267 A1 published on 13 Jul. 2006). The eighth related art is US Patent Application by Suzuki at al. (US 2006/0198401 A1 published on 7 Sep. 2006). The ninth related art is US Patent Application by Yamazaki (US 2006/0198415 A1, 7 Sep. 2006). The tenth related art is US Patent Application by Yamazaki (US 2006/0198416 A1 published on 7 Sep. 2006). The eleventh related art is US Patent Application by Yamazaki (US 2006/0222038 A1 published on 5 Oct. 2006). The twelfth related art is US Patent Application by Yamazaki (US 2006/0222030 A1 published on 5 Oct. 2006).

FIG. 8 is triple-ring reflector tunable source based on the tap-outcoupling scheme. The benefits offered by the tap-outcoupling scheme for this device are the same as stated above for the tunable 3-section DBR laser, namely, a higher output power and a smaller power variation during tuning operation, and maybe most importantly the light is outputted into a waveguide on the PLC chip thereby enabling a higher degree of integration than in the devices disclosed in the above seventh to twelfth related arts.

In FIG. 8, the front facet of the SOA chip is HR-coated as the reflector 2A in order to provide large reflection over the whole tuning range of the laser, and the multiple ring resonator filter ensures single-mode operation. It should be noted that the tap section 6 has been placed as close as possible to the gain section 4 of the SOA in order to avoid optical loss in between the gain section 4 and the outcoupling tap 6 as much as possible for achieving optimum output power performance. The output facet of the PLC chip should preferably be AR-coated to prevent spurious optical feedback to the laser.

Another example of the tunable laser source (TLS) based on the tap outcoupling scheme is shown in FIG. 9. In this example, a waveguide loop mirror functions as a reflector and a multiple ring resonator functions as a filter. That is, the reflector function and the filter function are achieved by separate units. The laser cavity is formed between the reflector 2A and the waveguide loop mirror. The outcoupling tap is located between the SOA waveguide and the multiple ring resonator.

In contrast to the TLS depicted in FIG. 8, the TLS shown in FIG. 9 utilizes not only the forward-oriented tap-port for outcoupling of the output light, but also the backward-oriented tap-port for controlling the laser. The light outcoupled into the backward-oriented tap-port is guided to a photodiode (PD) 32 whose signal can then, for example, be evaluated by a digital signal processor, a microprocessor or an analog circuit (all not shown) to gain insights on the current state of the laser and to lock it to a stable operation point by adjusting control parameters in response to the PD output signal.

Figure 10A:
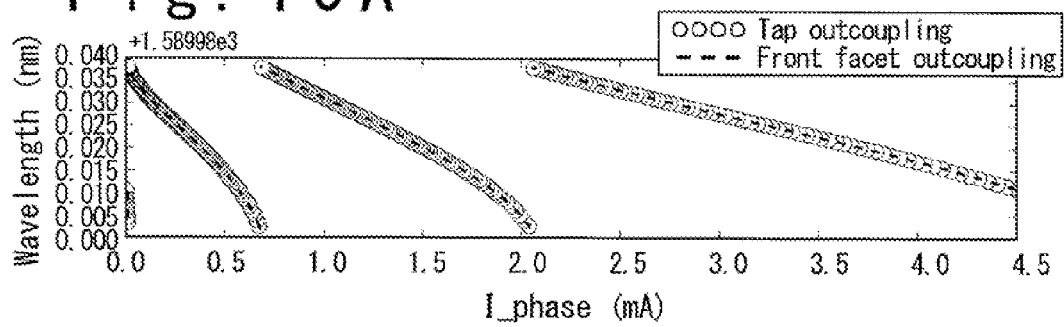
FIGS. 10A to 10D are diagrams showing simulation data when the tap outcoupling scheme and a front facet outcoupling scheme are compared.
Figure 10B:
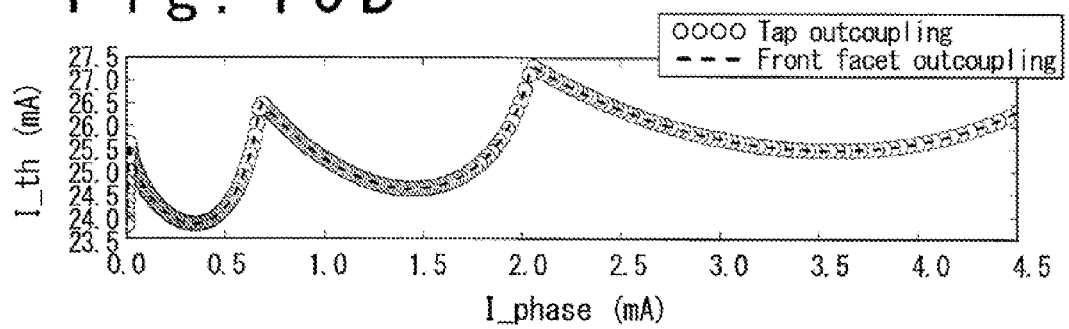
Figure 10C:
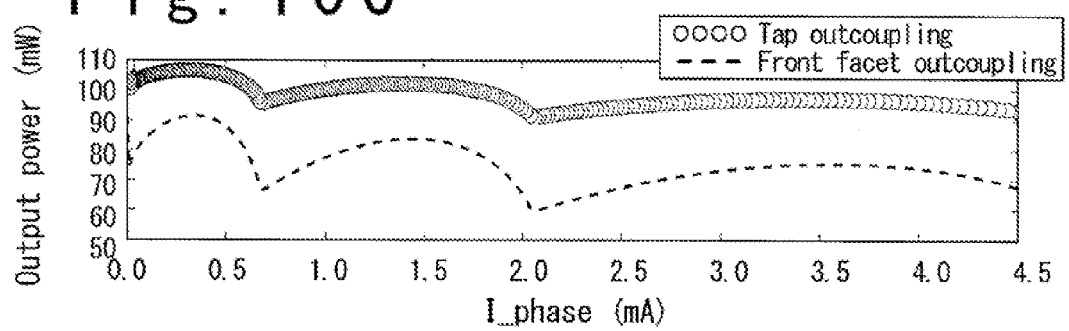

FIGS. 10A to 10D show simulation data relating to the device depicted in FIG. 9 and compare the performance characteristics of the tap outcoupling scheme based device with the its counterpart that outputs its light from the front facet. Except for the front facet coating and the tap, identical physical parameters were assumed in the simulations. The multiple ring resonator filter was assumed to be tuned for maximum transmission at the wavelength of 1590.000 nm. FIG. 10A shows the variation of the emission wavelength as a function of the phase control current (denoted as I_ph in FIGS. 10A to 10D), which is used to fine tune, the emission wavelength. FIG. 10B shows the variation of the threshold current (denoted as I_th). In both graphs (FIGS. 10A and 10B), the data points corresponding to the tap and the front facet outcoupling scheme overlap, which demonstrates that these devices are equal with respect to the effective mirror loss and other relevant device parameters. Despite that, FIG. 10C obviously proves that the tap outcoupling scheme is superior in terms of the output power performance. It should be noted that the tap outcoupling scheme provides a significantly larger output power which could not be achieved with the related-art front facet outcoupling scheme. Moreover, it should be noted that not only the absolute value of the output power is higher in the tap outcoupling scheme, but also the power variation with increasing phase control current is significantly smaller in the tap outcoupling scheme, which provides additional benefits, as will be discussed below.

In the present example, the output power at the first output power maximum is about 18% larger in the at outcoupling scheme, and owing to the smaller output power variation, that difference increases to 31% at the third outputs power maximum. In some cases, it is desirable to modulate the emission frequency of the laser (for example, to increase the stimulated Brillouin scattering threshold power in optical fibers). As can be seen from FIGS. 10A and 10C, a frequency modulation goes along with an amplitude modulation, which is, however, not desired. Hence, also the power variation within one phase period (the period within which the emission wavelength changes by one FP spacing) is of relevance and should be as small as possible. Clearly the tap outcoupling scheme is also superior in this respect.

Figure 10D:
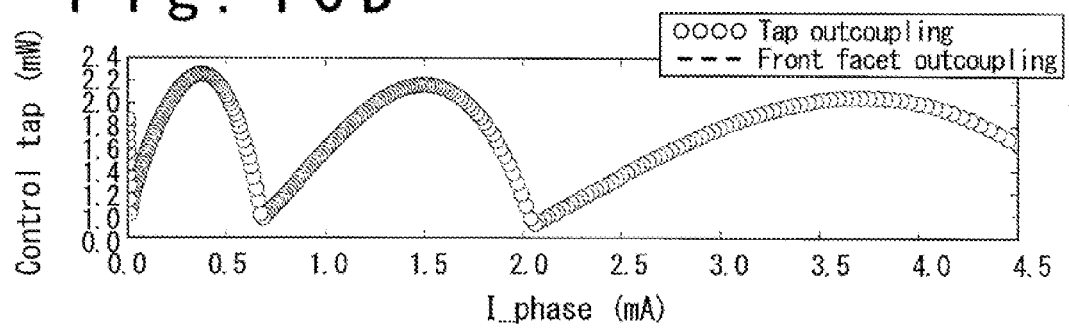

Another benefit of the tap outcoupling scheme is illustrated in FIG. 10D, which shows the backward-oriented tap-port output (labeled "Control tap" in FIG. 10D) which is guided towards the laser control PD in the device shown in FIG. 9. As can be seen, the control tap-port shows clear maxima in vicinity of the laser output power maxima and, therefore, it is well suited for controlling the laser. The example shown in FIG. 10D illustrates that the backward-oriented tap-port can be used to control the phase control current. Additionally, it is also possible, to control other laser parameters, such as the relative alignment of the ring resonators. As the transmission through the ring filter will be maximal when transmission maxima of all 3-ring filters are aligned, the output from the control tap will be maximal in that case. Hence, the control tap provides a very convenient means for controlling and optimizing a large number of laser operation parameters, which is a feature that is not easily achievable using the conventional front facet outcoupling scheme.

Figure 1:
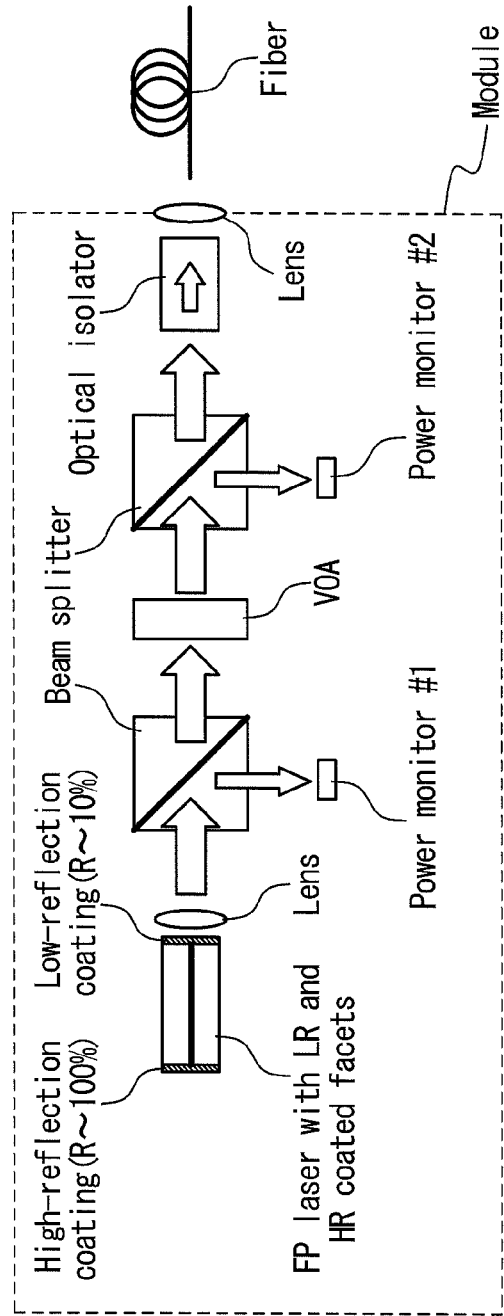
FIG. 1 is a diagram showing a laser module of a related art in which a Fabry-Pérot (FP) laser diode is integrated with a power monitor, a variable optical attenuator (VOA), and an optical isolator.
Figure 2:
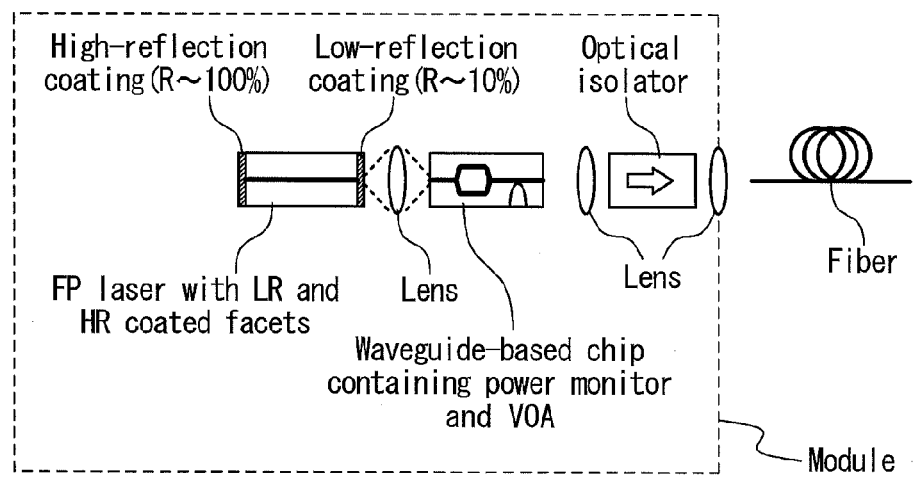
FIG. 2 is a diagram showing a laser module of a related art in which a FP laser diode is integrated with an optical/optoelectronic waveguide-based chip that provides power monitoring and VOA functions.
Figure 3:
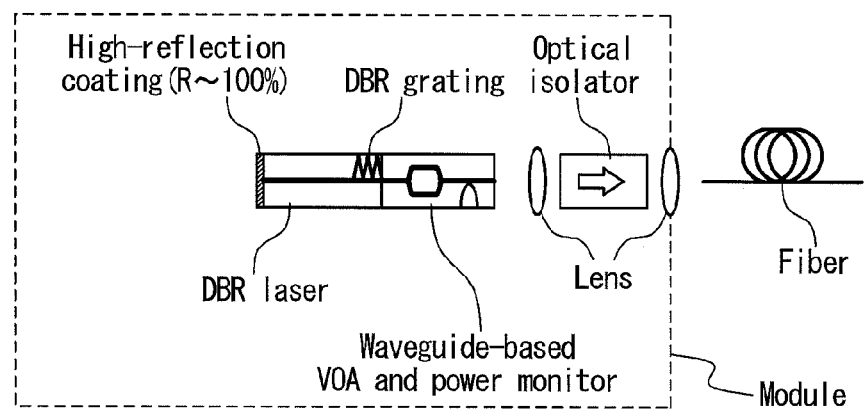
FIG. 3 is a diagram showing a laser module of a related art in which a distributed Bragg reflector (DBR) laser diode is integrated with a waveguide-based power monitor and a VOA.
Figure 4:
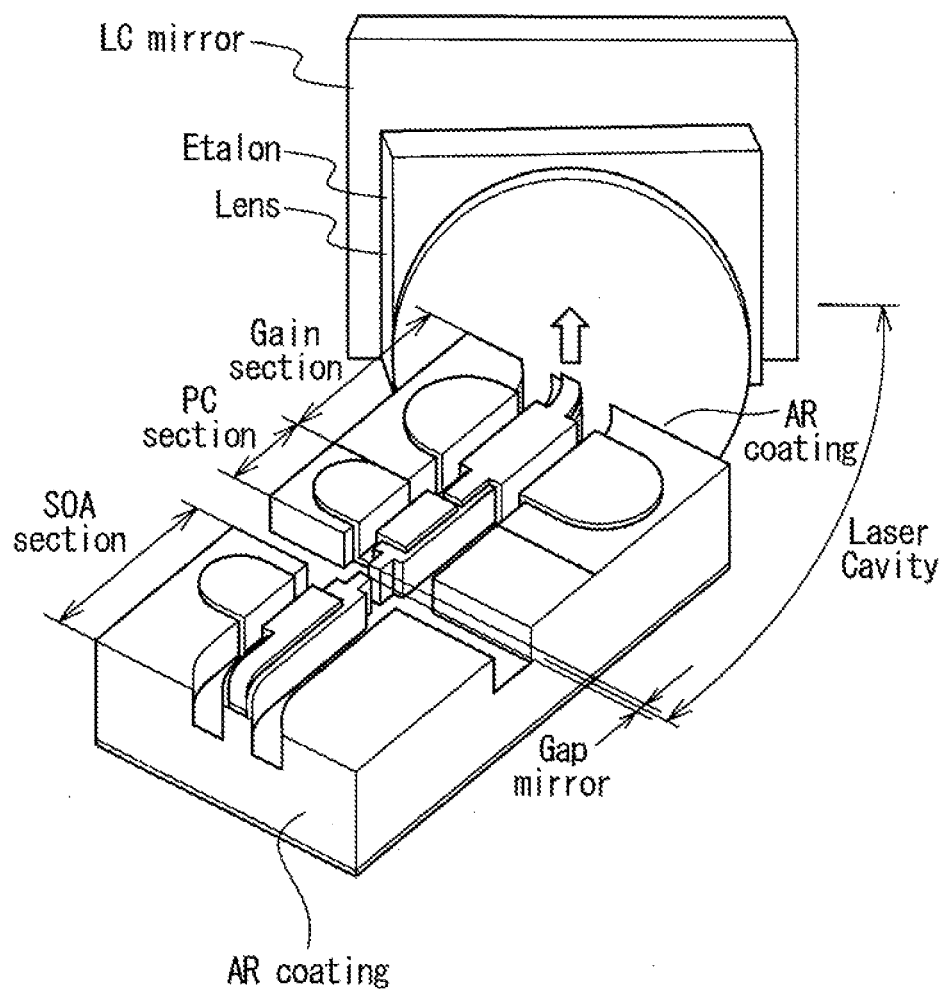
FIG. 4 is a diagram showing an example of a monolithic integration platform based on a gap mirror.
Figure 5:
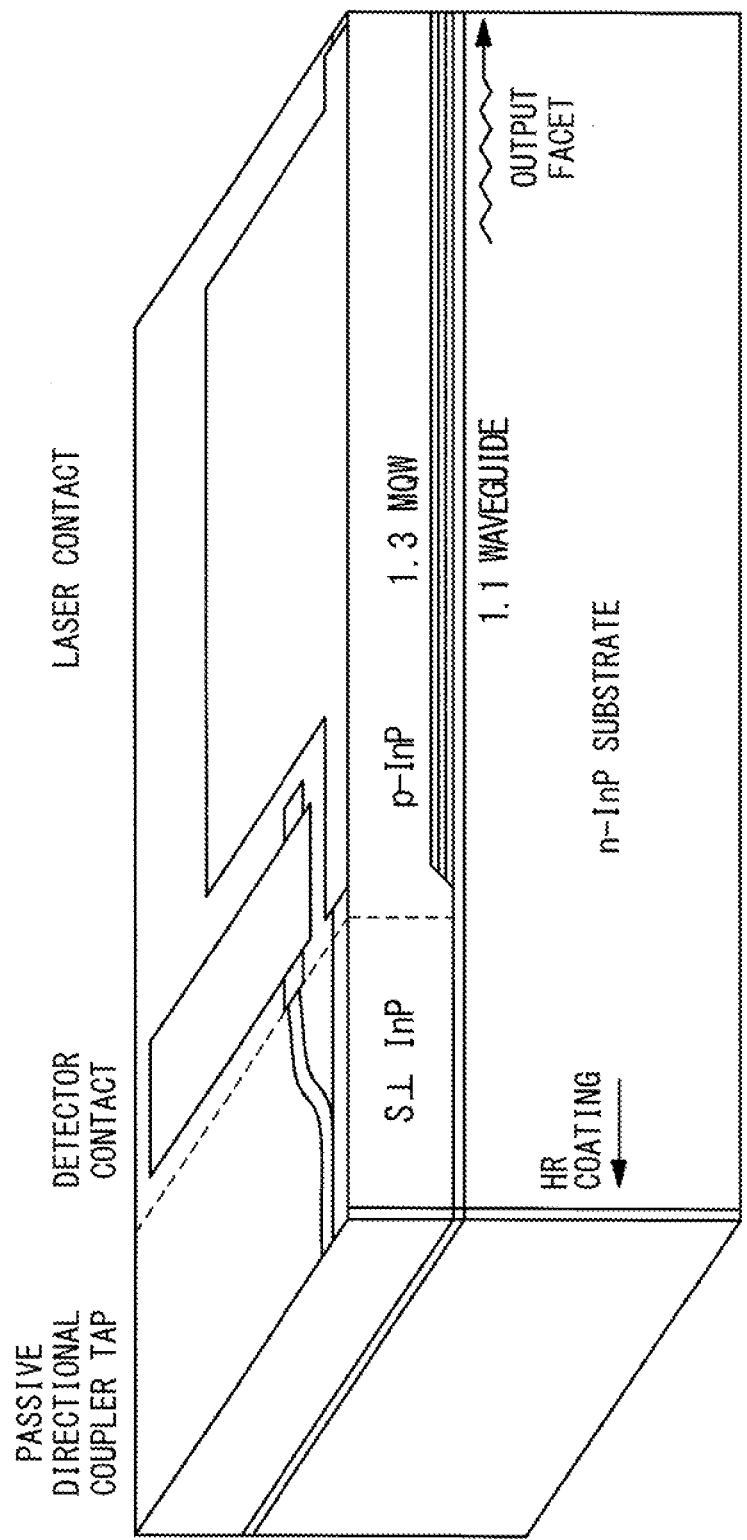
FIG. 5 is a diagram showing a FP laser with intracavity tap used for power monitoring purposes.
Figure 11:
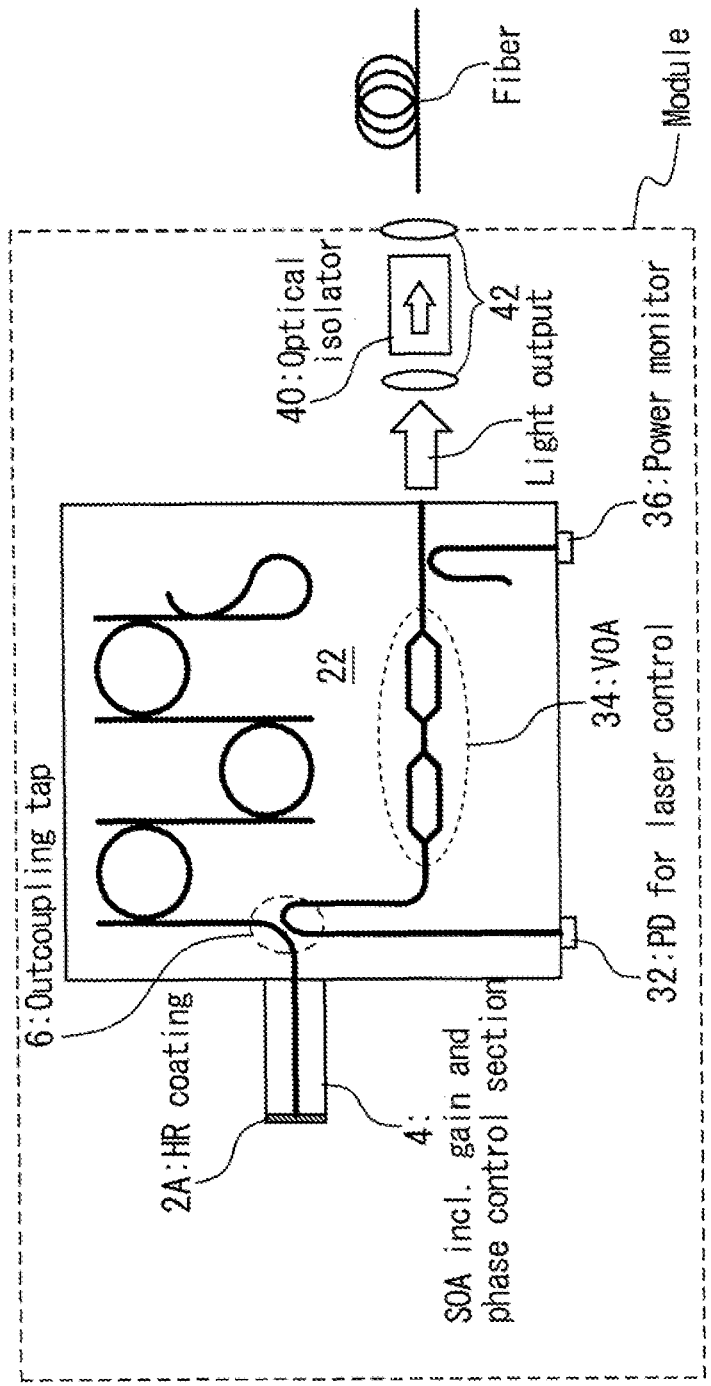
FIG. 11 is a diagram showing a laser module using a 3-ring reflector tunable laser source in which the laser source is integrated with an on-chip VOA and a power monitor to reduce external components.

The benefit of having a waveguide output for the laser light is illustrated in FIG. 11 showing a TLS based on the tap-outcoupling scheme that has been integrated with a VOA (a dual stage Mach-Zehnder modulator in the present example) 34 and a power monitor 36. Such components can be readily realized using available and well-known waveguide technology. Integrating these components directly on the same chip as the tunable laser source greatly reduces the part count of the external, bulk optical/optoelectronic components required to fabricate a module. Hence, the tap outcoupling scheme is effective in reducing the fabrication complexity and cost. As shown in FIG. 11, the only components needed to realize a complete module are two lenses 42 and an optical isolator 40, which should be compared to the part count of the device shown for example in FIG. 1, it is needless to say that obviously a large number of different functionalities (such as VOAs, power monitors, wavelength monitors, modulators, etc.) can be integrated with the tunable laser source by employing the tap outcoupling scheme, which provides the way for realizing compact and highly integrated laser sources.

From the preceding discussions, it should be obvious that laser modules utilizing the tap outcoupling scheme will be more compact, less complex, easier to fabricate, and ultimately less expensive and more reliable than their counterparts employing conventional outcoupling schemes.

Finally, it should be mentioned that many taps can be tuned (for example, by the thermo-optic or electro-optic effects) to some extent and, thus, the fraction of out coupled light, or in other words, the effective "mirror" loss may be varied even after fabrication. This strategy appears useful for optimizing the laser properties and is not achievable with the conventional front facet outcoupling scheme.

While the present invention has been particularly shown and described with reference to the exemplary embodiments thereof, the present invention is not limited to these exemplary embodiments. It will be understood by those of ordinary skill in the art that various changes in form and details may be made therein without departing from the spirit and scope of the present invention as defined by the claims.

The invention claimed is:

1. A laser source comprising:
a laser beam generating section configured to generate a laser beam in a cavity between first reflector and a second reflector; and
a tap section provided in said cavity to take out a part of said laser beam,
wherein said laser beam generating section comprises:
a semiconductor optical amplifier (SOA) comprising a first optical waveguide connected to said first reflector; and
a multiple ring resonator filter connected to said second reflector and comprising a second optical waveguide connected to said first optical waveguide, and
wherein said multiple ring resonator filter and said second optical waveguide are formed on a PLC (planar lightwave circuit) chip, and a chip of said semiconductor optical amplifier (SOA) is mounted on said PLC chip.

2. The laser source according to claim 1, wherein said laser beam generating section further comprises:
a phase control section provided between said first and second reflectors to perform fine adjustment of the wavelength of said laser beam.

3. The laser source according to claim 1, wherein said tap section comprises one of a directional coupler, a multi-mode interface (MMI) splitter, and a Y-splitter.

4. The laser source according to claim 1, wherein a fraction of light outcoupling by said tap section is tunable.

5. The laser source according to claim 3, wherein said laser beam generating section comprises:
 a semiconductor optical amplifier comprising a first optical waveguide connected to said first reflector; and
 a multiple ring resonator filter comprising a second optical waveguide connected to said first optical waveguide and a termination optical waveguide configured to form said second reflector.

6. The laser source according to claim 5, wherein said multiple ring resonator filter further comprises a third optical waveguide such that said directional coupler of said tap section is formed from said second and third optical waveguides, and
 said laser beam part is outputted from one end of said third optical waveguide.

7. The laser source according to claim 6, wherein the other end of said third optical waveguide is connected to a port which is connected to a photodiode.

8. The laser source according to claim 6, further comprising:
 a variable optical attenuator inserted in said third optical waveguide.

9. The laser source according to claim 8, further comprising:
 a fourth optical waveguide connected to a port which is connected to a power monitor, said fourth optical waveguide forming a directional coupler together with said third optical waveguide.

10. An optical module comprising:
 a laser source which comprises:
 a laser beam generating section configured to generate a laser beam in a cavity between first reflector and a second reflector; and
 a tap section provided in said cavity to take out a part of said laser beam,
 wherein said laser beam generating section comprises:
  a semiconductor optical amplifier (SOA) comprising a first optical waveguide connected to said first reflector; and
  a multiple ring resonator filter connected to said second reflector and comprising a second optical waveguide connected to said first optical waveguide, and
 wherein said multiple ring resonator filter and said second optical waveguide are formed on a PLC (planar lightwave circuit) chip, and a chip of said semiconductor optical amplifier (SOA) is mounted on said PLC chip,
 first lens provided for said tap section;
 an optical isolator provided for said first lens; and
 a second lens provided for said optical isolator.

11. A laser beam outcoupling method comprising:
 generating a laser beam in a cavity between first reflector and a second reflector; and
 outcoupling a part of said laser beam from said cavity,
 wherein said generating comprises
 transferring the laser beam through a first optical waveguide connected to said first reflector;
 filtering the laser beam while transferring the laser beam through a second optical waveguide connected to said first optical waveguide; and
 reflecting the filtered laser beams by said second reflector.

12. The laser beam outcoupling method according to claim 11, wherein said cavity is an optical waveguide-based cavity.

13. The laser beam outcoupling method according to claim 11, further comprising:
 directly coupling said laser beam part outcoupled from said laser cavity into a second optical waveguide.

14. The laser beam outcoupling method according to claim 11, wherein said generating a laser beam comprises:
 selecting a single optical mode by a filter section incorporated in said cavity between said first and second reflectors.

15. The laser beam outcoupling method according to claim 11, further comprising:
 generating a signal to control a laser source from a portion of the outcoupled laser beam part.

16. The laser source according to claim 1, wherein said tap section is placed as close as possible to a gain section of said semiconductor optical amplifier, to avoid optical loss.

17. The laser source according to claim 1, wherein a waveguide loop mirror is provided to function as said second reflector.

18. The laser source according to claim 1, wherein said laser source is a tunable laser source which utilizes not only a forward-oriented tap-port for outcoupling of the laser beam, but also a backward-oriented tap-port for controlling a laser of said laser beam generating section.

19. The laser source according to claim 1, wherein said laser source is a tunable laser source which is integrated with a VOA (variable optical attenuator) and a power monitor on the PLC chip.

* * * * *